United States Patent [19]

Gibson et al.

[11] 4,240,074
[45] Dec. 16, 1980

[54] ELECTRICAL DIGITAL DISPLAY INDICATORS

[75] Inventors: Harry Gibson, Bredon; Peter F. Maycock, Cheltenham, both of England

[73] Assignee: Smiths Industries Limited, Cricklewood, England

[21] Appl. No.: 11,588

[22] Filed: Feb. 12, 1979

[30] Foreign Application Priority Data

Feb. 17, 1978 [GB] United Kingdom ............... 6406/78

[51] Int. Cl.² .................. G08B 25/00; G06F 3/14; G09F 9/32
[52] U.S. Cl. ............................. 340/753; 340/792
[58] Field of Search ............. 340/753, 792, 793, 27 R, 340/782

[56] References Cited

U.S. PATENT DOCUMENTS

| | | | |
|---|---|---|---|
| 3,275,871 | 9/1966 | Yiotis | 340/753 |
| 3,343,155 | 9/1967 | Pahlavan | 340/753 |
| 3,460,127 | 8/1969 | Pahlavan | 340/753 |
| 3,594,757 | 7/1971 | Gard et al. | 340/27 R |
| 3,914,758 | 10/1975 | Ingle | 340/793 |
| 4,155,084 | 5/1979 | Klees | 340/753 |

*Primary Examiner*—Thomas A. Robinson
*Attorney, Agent, or Firm*—Pollock, Vande Sande & Priddy

[57] ABSTRACT

An electrical indicator for providing a digital display representation of the value of an input variable has four display areas, each area being arranged to display an individual one of the digits of a four digit number representative of the value of the input variable. Each display area is in the form of a matrix array of light-emitting diodes. The indicator includes a computing unit which is arranged to energize those diodes making up each digit and, by varying the energization, to cause displacement of the least-significant digit within its display area upon change in value of the input variable. Digits within the other areas remain stationary until an adjacent less-significant digit is moved between '0' and '9' when the more-significant digit is displaced in synchronism with the less-significant digit. The computing unit includes a store which contains information as to which diodes should be energized to represent any particular digit. The computing unit initially addresses only those locations in the store relating to diodes along one row of the matrix, and is incremented subsequently to read out information relating to other rows.

12 Claims, 5 Drawing Figures

4,240,074

ELECTRICAL DIGITAL DISPLAY INDICATORS

BACKGROUND OF THE INVENTION

This invention relates to electrical indicators.

The invention is particularly concerned with electrical indicators for providing a digital display representation of the value of an input variable.

In previous digital indicators there is provided a plurality of display areas in each of which an individual digit can be displayed. When the input variable supplied to the indicator varies, the energisation of the areas is changed instantaneously so as to display a new value. While such indicators are satisfactory in certain applications they do suffer from a number of disadvantages. In particular, it is not possible to ascertain the manner in which the input variable is changing until the least-significant digit is actually changed to a new value. Such indicators, furthermore, do not provide a true indication of the input variable where its value lies somewhere between adjacent digits. Moreover, where the input variable oscillates slowly this can cause a distracting winking of the least-significant digit as it changes value.

BRIEF SUMMARY OF THE INVENTION

It is an object of the present invention to provide an improved form of indicator which avoids the disadvantages referred to above.

According to the present invention there is provided an electrical indicator for providing a digital display representation of the value of an input variable, said indicator including a display area comprising a matrix array of electrically-energisable elements, means for selectively energising some at least of said elements such as to provide a display representation of a part at least of a digit of said digital display representation and such as to effect displacement of said representation relative to said display area in accordance with change in value of said input variable.

The electrical indicator may include a plurality of display areas, and each said display area may comprise a matrix array of electrically-energisable elements. The energising means may selectively energise those elements in that display area displaying a representation of a more-significant digit so that the display representation remains stationary within that area for all changes in value of the input variable except for those changes causing displacement between the highest value and the lowest value of the less-significant digit upon which the more-significant digit is displaced in synchronism with the less-significant digit. The electrically-energisable elements may be light-emitting diodes.

An electrical indicator in accordance with the present invention and having a four-digit display will now be described, by way of example, with reference to the accompanying drawings.

DETAILED DESCRIPTION

Figure 1:
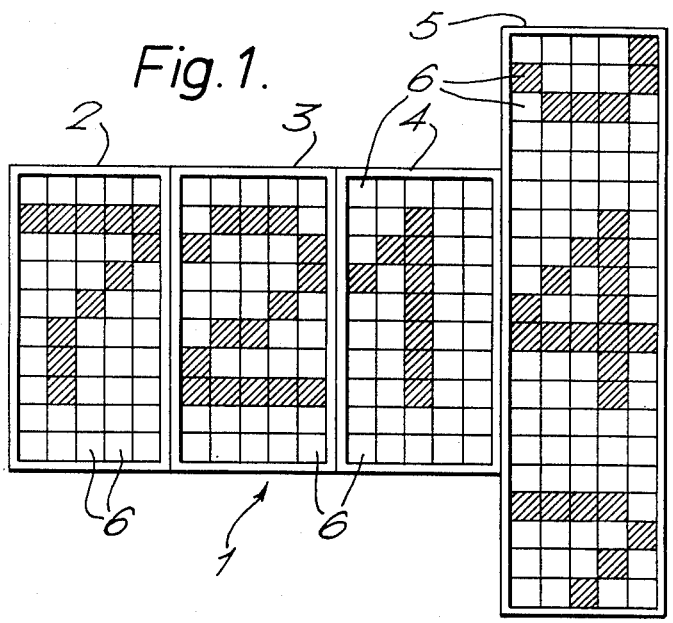
FIGS. 1, 2 and 3 show diagrammatically the indicator display representing three different values.

With reference to FIG. 1, there is shown a four-digit display unit 1, for displaying the value of an input variable in the form of a four digit number such as, for example, the number '7214'. The display unit 1 includes four individual display areas or panels 2 to 5 each made up of a matrix array of light-emitting diodes 6. The three panels 2, 3 and 4 to the left-hand side of the unit 1 each have a matrix of five by ten light-emitting diodes. Each of the panels 2 to 4 is arranged for normally displaying an individual one of the three most-significant digits or numerals of the four digit number, that is, the digits '7', '2' and '1' respectively, in a a central part of the panel formed by a five by seven matrix of the light-emitting diodes 6.

The right-hand panel 5 is twice the height of the other panels 2, 3 and 4, comprising an array of five by twenty light-emitting diodes 6 and extending an equal distance above and below the adjacent panel 4. This panel 5 displays the least-significant digit of the four digit number, that is, the numeral '4' shown in FIG. 1. The panel 5 is of sufficient length to enable two entire digits to be displayed simultaneously, or, as shown in FIG. 1, to display all of one digit ('4'), together with the upper part of the preceding digit ('3') in the bottom part of the panel, and the lower part of the following digit ('5') in the top part of the panel.

Figure 2:
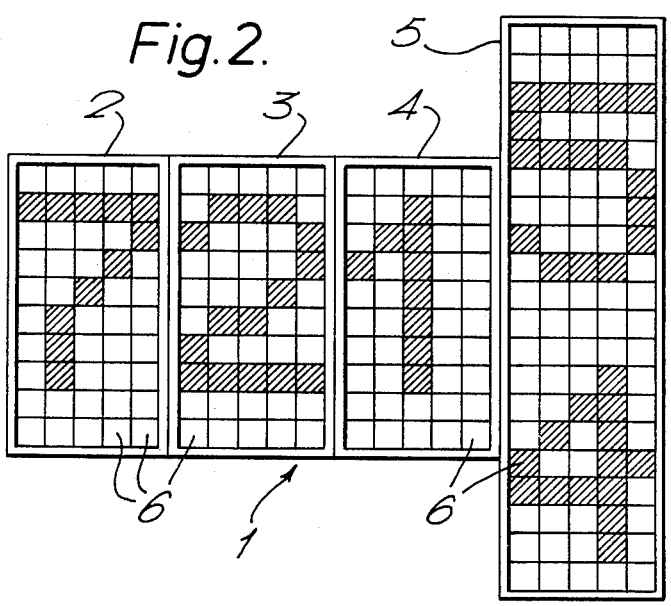
Figure 3:
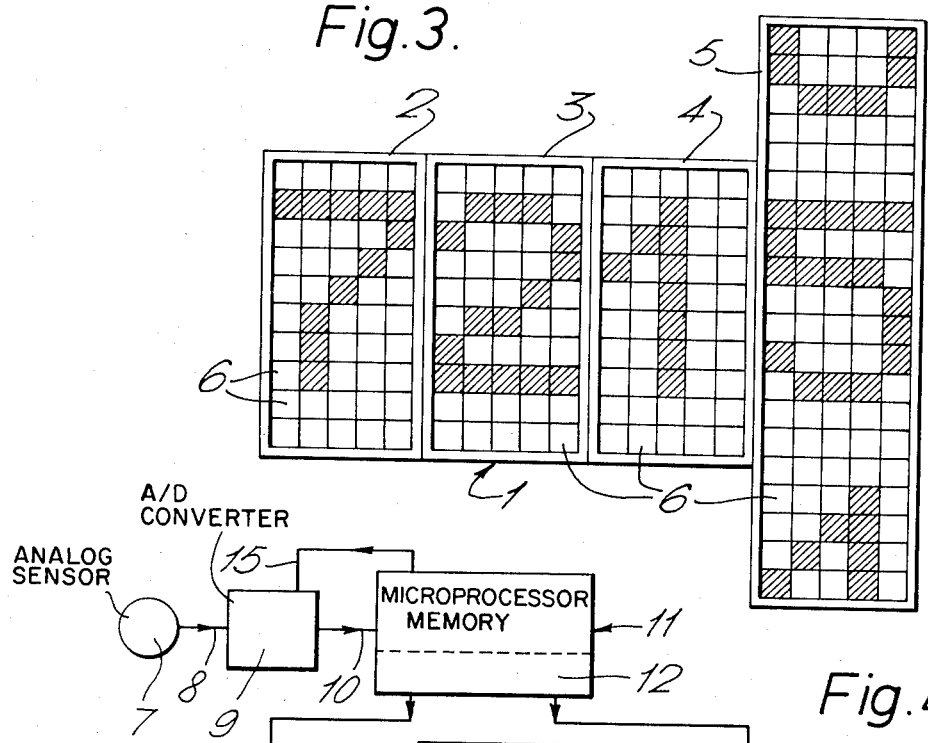

As the value of the input variable rises from '7214' to '7215', the least-significant digit on the display unit will change gradually from '4' to '5'. To effect this change the digit '4' is moved downwards in the panel 5 one row at a time to displace the '3' in the bottom of the panel and to lower the '5' at the top of the panel through the position shown in FIG. 2 to that shown in FIG. 3. When the input variable becomes exactly equal to '7215' the least-significant digit '5' in the panel 5 will be positioned level with the panels 2, 3 and 4, as shown in FIG. 3. If, however, the input variable were to change to a value between '7214' and '7215' the digit '5' would remain positioned above the level of the panels 2, 3 and 4, such as shown in FIG. 2. The final panel 5 thereby provides a 'drum-type' counter in which the least-significant digit can be 'rolled' up or down in accordance with changes of the input variable.

When the least-significant digit changes from its highest value '9' to its lowest value '0', the adjacent, more-significant digit is displaced downwards in the panel 4 in synchronism with movement of the least-significant digit (that is, the '9') so as to step up the digit displayed in panel 4 by one unit. Similarly, when the least-significant digit changes from '0' to '9' (for a decreasing value of the input variable), the adjacent more-significant digit is displaced upwards in the panel 4 in synchronism with the least-significant digit (in this case, the '0') so as to step down the digit displayed in panel 4 by one unit. The digit displayed in the panel 4 remains stationary until the digit displayed in the adjacent, less-significant panel 5 changes from '9' to '0' or from '0' to '9' when it will be displaced to bring a higher or lower digit into view. The other panels 2 and 3 operate in the same manner so as to give the appearance of being ganged together in the same way as a mechanical drum counter. Because the panels 2 to 4 are taller than the digits displayed within them (that is, they are larger in the direction of displacement of the digits) the digits can be displaced to a limited extent in either direction without losing a part of them. It would of course be possible to operate some or all of the more significant panels 2, 3 and 4 in the same manner as in previous displays where the digit displayed is stepped up or down instantaneously by one unit and where only one digit is visible in each panel at any one time.

Figure 4:
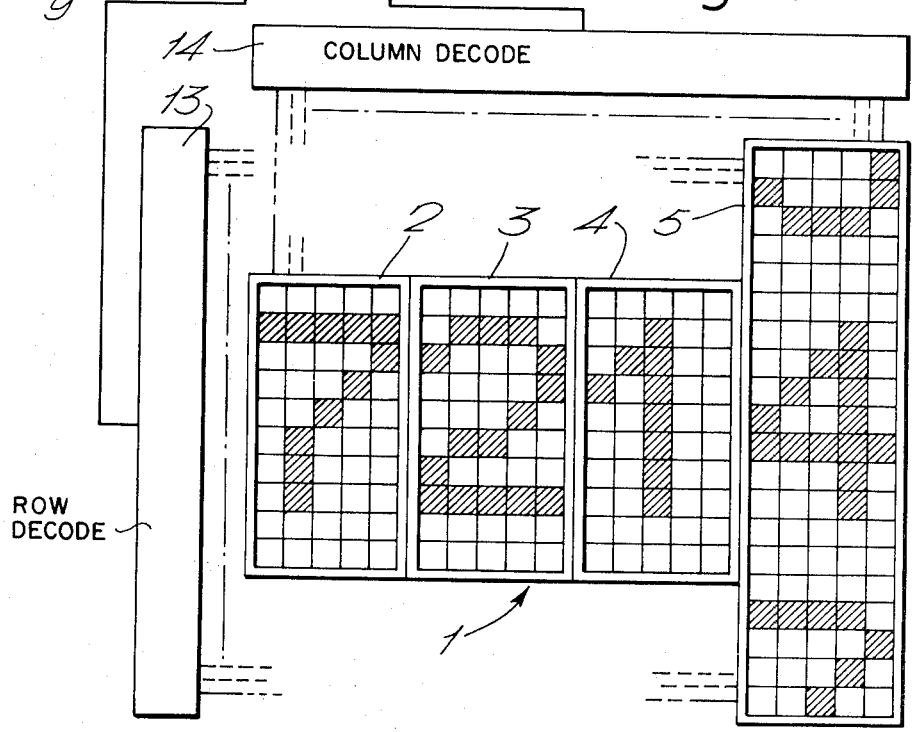
FIG. 4 is a schematic representation of the indicator circuitry.

The display unit 1 is connected in the indicator circuit shown in FIG. 4. Analogue signals derived in accordance with the input variable are supplied by a sensor 7 along line 8 to an analogue-to-digital converter 9. The converter 9 operates to derive a base-address signal in accordance with the value of the input variable, this signal being supplied along line 10 to a microprocessor computing unit 11.

The computing unit 11 has storage locations, such as, for example, are provided by a read-only memory 12, in which is stored information defining the patterns of diodes 6 in each of the four panels 2 to 5 to be energised in order to represent any particular four digit number. The base-address signal is a digital representation of an address in the memory 12 and, when supplied to the unit 11 causes the memory to read out information relating to the energisation of the bottom row of the display. In this respect, the three more significant panels 2 to 4 are regarded as being made up of a twenty by five matrix in the same way as the least significant panel 5. The information read out of the memory in respect of the bottom row of the panels 2 to 4 is not therefore utilised since there are no light-emitting diodes in the bottom five rows of these panels. For the four-digit number shown in FIG. 1 therefore the base-address signal causes energisation of only the diode 6 in the bottom row and eighteenth column of the unit 1, that is, the third column of the right-hand panel 5.

After read-out of information concerning the bottom row, the computing unit 11 increments the base-address signal such that information concerning energisation of diodes along the second row is now read out from the memory 12. The base-address is incremented nineteen times in this way until diodes have been addressed along the entire twenty rows of the display. Energisation of the diodes 6 is effected using standard multiplexing techniques by means of a row decode unit 13 and a column decode unit 14. The row decode unit 13 addresses initially the bottom row of the unit 1 and, when the base address signal is incremented addresses the adjacent row above it and so on in succession until it reaches the top row. The column decode unit 14 addresses initially that diode 6 in the left-hand column of the row being addressed by the row decode unit 14. The column decode unit 14 addresses adjacent diodes along that same row as information concerning energisation of each respective diode is read out of the memory 12. When the final diode along that row has been addressed, the row decode unit 13 is incremented and the column decode unit 14 then starts again by addressing the left-hand diode in the next row.

When all twenty rows of the display panels have been addressed, the computing unit 11 supplies a signal along line 15 to the analogue-to-digital converter 9 such as to cause the converter 9 to supply a new base-address signal to the computing unit 11 along line 10 in accordance with the value of the input variable at that time. This new base-address signal is then incremented to build up a new display picture in the same manner as before. If the value of the input variable is unchanged since the first base-address signal was taken, the number represented by the display will be the same. If, however, the value has changed, the new base-address signal will differ from the first signal and new storage locations 12 within the computing unit 11 will be addressed. If the change in value is small, such that the first three significant digits of the number representing its value are unchanged, then the same storage locations as for the first base-address signal will be addressed for the three panels 2, 3 and 4. Different storage locations will, however, be addressed for the least-significant panel 5 such that the position of the digits within the panel is altered. Base-address signals are read out of the converter 9 many times each second and the diodes 6 of the display panels 2 to 5 are similarly energised many times each second so as to give an apparent constant brightness without flickering. Repeated changes in position of the digits in the least-significant panel 5 gives an appearance of movement up or down the panel the rate of which movement varies in accordance with the rate of change in value of the input variable.

The form of display described enables the trend of change of the indicated value to be readily recognised by observing the direction of movement, that is, up or down, of the least-significant digit within the right-hand panel 5. It is possible in this way, to determine readily whether the indicated value is increasing or decreasing. In previous displays, where only one least-significant digit is shown at any time, it is necessary to wait until the final digit has been changed and to assess whether that digit is greater than or less than the previously displayed digit before the trend of change can be determined.

The present form of display also avoids the distracting flashing or winking of the least-significant digit which occurs with previous displays when the input variable is oscillating slowly. In the present arrangement the final digit merely moves up and down the display panel 5 without such a distracting appearance.

In these respects therefore the display has the advantages of conventional rotating drum-type counters while lacking the disadvantages of such counters inherent in their mechanical operation and moving parts. This form of electronic display can also more easily be used in conjunction with digital electronics circuitry than the mechanical type of counter.

While it is necessary for the final, least-significant, panel 5 to be formed of a matrix of display elements—in order that the digits can be displaced up and down the display—it is not necessary for the other panels 2, 3 and 4 to be similarly formed if they are only required to change value instantaneously. The panels 2, 3 and 4 could for example be of the well-known 'seven-segment' type in which digits are displayed by selectively energising elements arranged in a figure-of-eight pattern. Alternatively, the panels 2, 3 and 4 could be of the incandescent filament form or any other form of electrically-operated display.

The least-significant digit panel 5 itself need not necessarily be formed by light-emitting diodes but could for example, be formed by liquid-crystal, gas-discharge, electroluminescence, plasma or electrophoretic elements and, in general, any electrically-operated display capable of providing selectively energisable elements of a suitable size for a particular application could be used.

The panel 5 need not be as large, in proportion to the size of the numerals to be displayed, as shown in the drawings. The panel 5 could be the same size as the panels 2 to 4 so that only one entire numeral could be displayed at any one time. It would still be possible to determine whether the indicated value was rising or falling by observing movement of the least-significant digit but it would be less easy to read the display since only the top of one digit and the bottom of another digit could be displayed in the panel at any one time.

Figure 5:
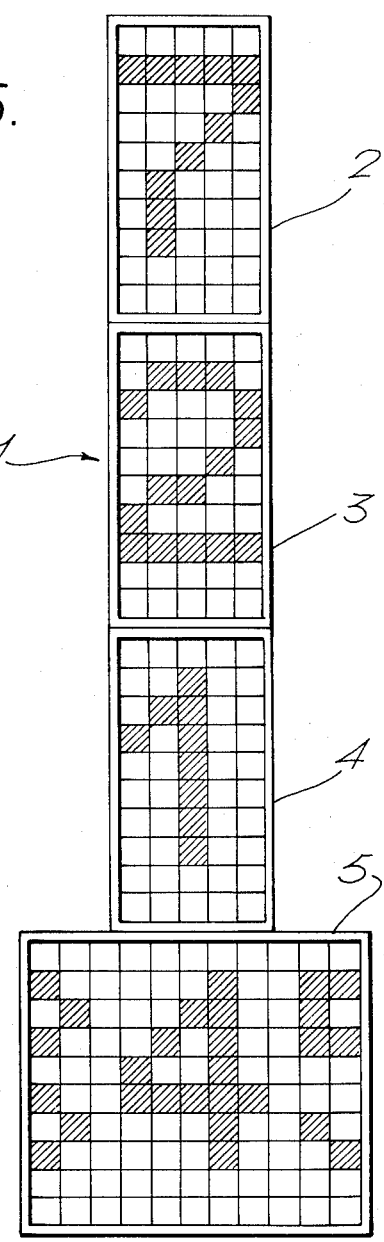
FIG. 5 illustrates an alternative configuration of the display.

It is not necessary that the panels of the display are arranged in the horizontal configuration shown in FIGS. 1 to 3; they could, for example, be located one above the other in the manner shown in FIG. 5. In this case the least-significant digit is displayed in the lowermost panel 5 and the digits are moved from left to right or right to left in an analagous manner to that described earlier.

It would of course be possible to use different founts for the numerals from those shown in the accompanying drawings and to use Hebrew, Arabic or other numeral forms.

The electrical indicator of the present invention can be used in many different applications but is especially suitable for use in aircraft instruments. In this respect the indicator may be used in Mach/Airspeed, Fuel Flow, $N_1$, E.G.T. and E.P.R. instruments in place of conventional mechanical drum-type counters. By this means people familiar with previous mechanical displays can easily make accurate readings of the electronic display provided by the present invention.

We claim:

1. An electrical indicator for providing a digital display representation of the value of an input variable, the indicator including a plurality of adjacent display areas, each said display area comprising a matrix array of electrically energisable elements that are arranged to be selectively energised to provide a display representation of a digit of a plural digit number, and energising means effecting displacement of the least-significant digit of said number within its respective display area in accordance with change in value of said input variable, the said energising means effecting displacement of a more-significant digit of said number within its respective display area in synchronism with an adjacent less-significant digit only when said energising means effects displacement of said less-significant digit between its highest value and its lowest value, the said more-significant digit remaining stationary within its respective display area for all other changes in value of said input variable.

2. An electrical indicator according to claim 1 including at least three display areas, each said display area comprising a matrix array of electrically-energisable-elements, wherein said energising means effects displacement within its respective display area of the display representation of each of those of said digits more significant than said least-significant digit only upon changes in value of said input variable causing said energising means to effect displacement between the highest value and the lowest value of its adjacent less-significant digit, and wherein said energising means effects displacement of those said display representations in synchronism with displacement of the said highest-value digit or the said lowest-value digit of its adjacent less-significant digit.

3. An electrical indicator according to claim 1 or claim 2, wherein said electrically-energisable elements are light-emitting diodes.

4. An electrical indicator according to claim 1 or claim 2, wherein said display area providing a representation of the said least-significant digit is larger in the direction of displacement of the said display representation than the display representation of a single digit within said area so that the said display representation can be displaced to a limited extent without loss of a part of said representation.

5. An electrical indicator according to claim 4 wherein each said display area is larger in the said direction of displacement than the display representation of a single digit within said area.

6. An electrical indicator according to claim 4 wherein said display area providing a representation of the said least-significant digit is larger in the direction of displacement of the said display representation than the or each other of said display areas.

7. An electrical indicator according to claim 6, wherein the said display area providing a display representation of the said least-significant digit extends on both sides of an adjacent display area in the said direction of displacement.

8. An electrical indicator according to claim 7, wherein said plurality of display areas are located side-by-side, the said display area providing the display representation of the least-significant digit extending above and below said adjacent display area, and wherein the said energising means effects displacement of the display representation of said least-significant digit up or down relative to said display area in accordance with change in value of said input variable.

9. An electrical indicator according to claim 6, wherein the said display area providing a display representation of the least-significant digit is sufficiently large to provide a display representation of two digits simultaneously within said display area.

10. An electrical indicator according to claim 1 or claim 2, wherein said energising means includes a store means containing information relating to energisation of elements of said matrix array, and addressing means, said addressing means addressing appropriate locations of said store means in accordance with the value of said input variable so as to read out said information and thereby effect energisation of those of said elements appropriate for said display representation, and wherein said addressing means is arranged to effect displacement of the said display representation relative to the said display area upon change in value of said input variable by addressing different ones of the locations of said store means.

11. An electrical indicator according to claim 10, wherein said addressing means addresses initially only those locations of said store means relating to energisation of elements along an individual line of said matrix array and wherein said addressing means is subsequently incremented step-by-step to read out information relating to other lines of said array.

12. A method of providing a digital display representation of the value of an input variable by selectively energising some at least of the elements of each of a plurality of matrix arrays of electrically-energisable elements so as thereby to provide a digital display representation of said value as a plural-digit number, varying energisation of said matrix array representing the least-significant digit of said number upon change in said value to effect displacement of said representation relative to said array in accordance with change in said value, varying energisation of another of said matrix arrays to effect displacement of the representation of a more-significant digit relative to its respective array in synchronism with an adjacent less-significant digit only when said less-significant digit is displaced between its highest value and its lowest value, the energisation of the said matrix arrays being maintained for all other changes in value of said input variable so as to thereby maintain said more-significant digit stationary.

* * * * *